United States Patent
Kim et al.

(10) Patent No.: US 10,747,619 B2
(45) Date of Patent: Aug. 18, 2020

(54) MEMORY SYSTEM AND OPERATING METHOD THEREOF

(71) Applicant: SK hynix Inc., Gyeonggi-do (KR)

(72) Inventors: Jang-Hyun Kim, Gyeonggi-do (KR); Jang-Hwan Jun, Gyeonggi-do (KR); Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 176 days.

(21) Appl. No.: 16/109,015

(22) Filed: Aug. 22, 2018

(65) Prior Publication Data

US 2019/0213079 A1    Jul. 11, 2019

(30) Foreign Application Priority Data

Jan. 11, 2018 (KR) .................. 10-2018-0003757

(51) Int. Cl.
*G06F 11/00* (2006.01)
*G06F 11/14* (2006.01)
(Continued)

(52) U.S. Cl.
CPC ............ *G06F 11/1417* (2013.01); *G06F 1/30* (2013.01); *G06F 9/442* (2013.01); *G06F 11/1441* (2013.01); *G11C 5/148* (2013.01); *G11C 7/14* (2013.01); *G11C 7/20* (2013.01); *G11C 29/76* (2013.01); *G06F 9/4401* (2013.01); *G11C 2029/0411* (2013.01)

(58) Field of Classification Search
CPC ............ G06F 11/1417; G06F 11/1441; G06F 11/1438; G06F 11/30; G06F 11/3037; G06F 1/30; G06F 1/24; G06F 1/305; G06F 1/3206; G06F 1/3225; G06F 9/442; G06F 9/4401; G11C 5/148; G11C 7/14; G11C 7/20; G11C 29/76; G11C 29/04; G11C 29/08; G11C 2029/0411
See application file for complete search history.

(56) References Cited

U.S. PATENT DOCUMENTS 10,445,194 B2 * 10/2019 Lee .................... G06F 3/0659
10,606,710 B2 *  3/2020 Kim ...................... G06F 1/30
(Continued)

FOREIGN PATENT DOCUMENTS

KR    1020040023486    3/2004
KR    1020090042039    4/2009

OTHER PUBLICATIONS

Chang, Yu-Ming, Ping-Hsien Lin, Ye-Jyun Lin, Tai-Chun Kuo, Yuan-Hao Chang, Yung-Chun Li, Hsiang-Pang Li, and K. C. Wang. "An efficient sudden-power-off-recovery design with guaranteed booting time for solid state drives." In 2016 IEEE 8th International Memory Workshop (IMW), pp. 1-4. IEEE, 2016. (Year: 2016).*

(Continued)

*Primary Examiner* — Anthony J Amoroso
(74) *Attorney, Agent, or Firm* — IP & T Group LLP

(57) ABSTRACT

An operating method of a memory system includes performing a boot-up operation, determining whether a sudden power-off recovery (SPOR) operation is performed successively a predetermined number of times, and performing additional SPOR operation when a predetermined waiting time elapses after performing the boot-up operation according to a result of the determining.

20 Claims, 10 Drawing Sheets

(51) Int. Cl.
*G11C 7/20* (2006.01)
*G06F 1/30* (2006.01)
*G06F 9/4401* (2018.01)
*G11C 7/14* (2006.01)
*G11C 29/00* (2006.01)
*G11C 5/14* (2006.01)
*G11C 29/04* (2006.01)

(56) References Cited

U.S. PATENT DOCUMENTS

| | | | | |
|---|---|---|---|---|
| 2004/0049629 | A1* | 3/2004 | Miura | G06F 11/1068 |
| | | | | 711/105 |
| 2004/0083405 | A1* | 4/2004 | Chang | G06F 11/0763 |
| | | | | 714/24 |
| 2009/0109786 | A1* | 4/2009 | Ye | G06F 12/0246 |
| | | | | 365/228 |
| 2015/0113342 | A1* | 4/2015 | Jung | G11C 8/14 |
| | | | | 714/721 |
| 2015/0127887 | A1* | 5/2015 | Kim | G11C 5/143 |
| | | | | 711/103 |
| 2016/0283401 | A1* | 9/2016 | Virajamangala | G06F 12/122 |
| 2017/0185336 | A1* | 6/2017 | Byun | G06F 1/30 |
| 2018/0081552 | A1* | 3/2018 | Lee | G06F 11/1451 |
| 2018/0095834 | A1* | 4/2018 | Fernando | G06F 11/1425 |
| 2018/0107412 | A1* | 4/2018 | Jun | G06F 3/0652 |
| 2018/0285213 | A1* | 10/2018 | Kim | G06F 11/1048 |
| 2019/0026195 | A1* | 1/2019 | Chen | G06F 11/1441 |

OTHER PUBLICATIONS

Kim, Dongwook, Youjip Won, Jaehyuk Cha, Sungroh Yoon, Jongmoo Choi, and Sooyong Kang. "Exploiting compression-induced internal fragmentation for power-off recovery in SSD." IEEE Transactions on Computers 65, No. 6 (2015): 1720-1733. (Year: 2015).*

* cited by examiner

MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2018-0003757, filed on Jan. 11, 2018, the disclosure of which is incorporated herein by reference in its entirety.

BACKGROUND

1. Field

Various embodiments of the present invention relate to a memory system. Particularly, the embodiments relate to a memory system including a non-volatile memory device and a controller, and an operating method of the memory system.

2. Description of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption. Examples of memory systems having such advantages include universal serial bus (USB) memory devices, memory cards having various interfaces, and solid state drives (SSD).

SUMMARY

Various embodiments of the present invention are directed to a memory system and an operating method of the memory system that weakens a disturbance phenomenon that may occur when sudden power-off (SPO) occurs repeatedly during a sudden power-off recovery (SPOR) operation.

In accordance with an embodiment of the present invention, an operating method of a memory system includes: performing a boot-up operation; determining whether a sudden power-off recovery (SPOR) operation is performed successively a predetermined number of times or more; and performing additional SPOR operation when a predetermined waiting time elapses after performing the boot-up operation according to a result of the determining.

The predetermined waiting time may be determined based on a maximum SPOR time.

The predetermined waiting time may be determined based on a time of an open memory block scanning operation.

The predetermined waiting time may be determined at random whenever the SPOR operation is performed.

The predetermined waiting time may increase whenever the SPOR operation is performed.

The predetermined waiting time may decrease whenever the SPOR operation is performed.

The predetermined waiting time may be constant regardless of a number of times that the SPOR operation is performed.

The predetermined waiting time may be determined as "0" according to a number of times that the SPOR operation is performed.

The SPOR operation may include: storing a start log in a log region included in the memory of the controller; detecting a boundary page where a program operation is interrupted due to occurrence of sudden power-off (SPO) by scanning an open memory block; programming dummy data in a page subsequent to the boundary page; and storing an end log in the log region.

In accordance with an embodiment of the present invention, a memory system includes: a memory device suitable for storing data; and a controller suitable for controlling the memory device, wherein the controller performs a boot-up operation, determines whether a sudden power-off recovery (SPOR) operation is performed successively a predetermined number of times, and performs additional SPOR operation when a predetermined waiting time elapses after performing the boot-up operation according to a result of the determining.

The predetermined waiting time may be determined based on a maximum SPOR time.

The predetermined waiting time may be determined based on a performance time of an open memory block scanning operation.

The predetermined waiting time may be determined at random whenever the SPOR operation is performed.

The predetermined waiting time may increase whenever the SPOR operation is performed.

The predetermined waiting time may decrease whenever the SPOR operation is performed.

The predetermined waiting time may be constant regardless of a number of times that the SPOR operation is performed.

The predetermined waiting time may be determined as "0" according to a number of times that the SPOR operation is performed.

The controller may perform the SPOR operation including an operation of storing a start log in a log region included in the memory of the controller, an operation of detecting a boundary page where a program operation is interrupted due to occurrence of sudden power-off (SPO) by scanning an open memory block, an operation of programming dummy data in a page subsequent to the boundary page, and an operation of storing an end log in the log region.

In accordance with an embodiment of the present invention, an operating method of a memory system includes: performing a boot-up operation; determining whether a sudden power-off recovery (SPOR) operation is performed successively a predetermined number of times; when it is determined that the SPOR operation is performed successively the predetermined number of times, waiting a predetermined time after performing the boot-up operation; and performing additional SPOR operation when the predetermined time elapses after performing the boot-up operation.

DETAILED DESCRIPTION

Figure 1:
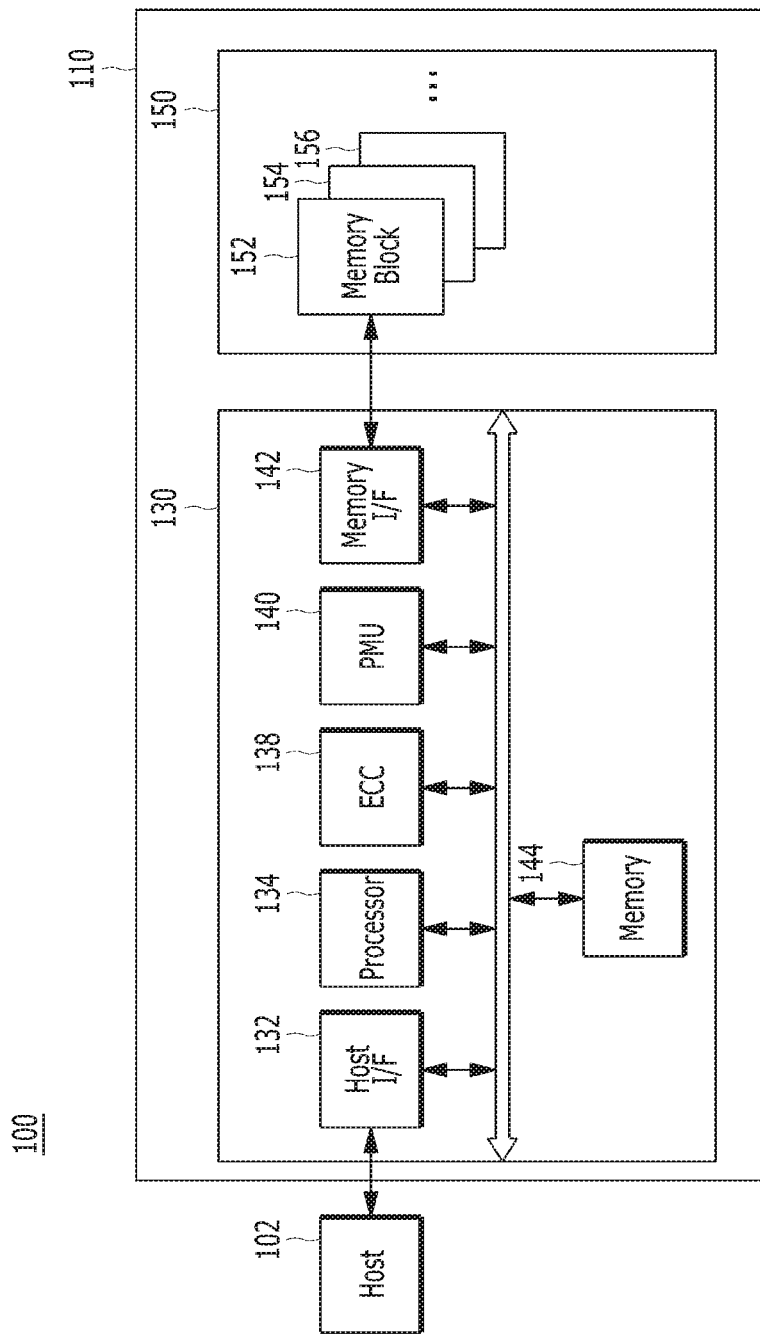
FIG. 1 is a block diagram illustrating a data processing system including a memory system in accordance with an embodiment of the present invention.

Various embodiments of the present invention are described below in more detail with reference to the accompanying drawings. However, various elements and features of the present invention may be configured or arranged differently than shown in the described embodiments, as will be apparent to those skilled in the art in light of this disclosure. Thus, the present invention is not limited to the embodiments set forth herein. Rather, the described embodiments are provided so that this disclosure is thorough and complete and fully conveys the present invention to those skilled in the art to which this invention pertains. Moreover, reference to "an embodiment" does not necessarily mean only one embodiment, and different references to "an embodiment" are not necessarily to the same embodiment(s). Throughout the disclosure, like reference numerals refer to like parts throughout the various figures and embodiments of the present invention.

It will be understood that, although the terms "first", "second", "third", and so on may be used herein to identify various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate various features of the disclosed embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to limit the present invention. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail n order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Various embodiments of the present invention will be described in detail with reference to the attached drawings.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by various types of storage devices. Examples of such storage devices may include, but are not limited to, volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD, micro-SD and SDHC, or universal flash storage (UFS) device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152, 154, 156 . . . (hereinafter, referred to as "memory blocks 152 to 156") each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of these elements and features are omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a memory I/F 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (DATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include all circuits, modules, systems or devices for error correction.

The PMU 140 may provide and manage power of the controller 130.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a central processing unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102, or other source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134, which is realized as a microprocessor or a CPU. The background operation performed onto the memory device 150 may include an operation of copying and processing data stored in some memory blocks among the memory blocks 152 to 156 of the memory device 150 into other memory blocks, e.g., a garbage collection (GC) operation, an operation of swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
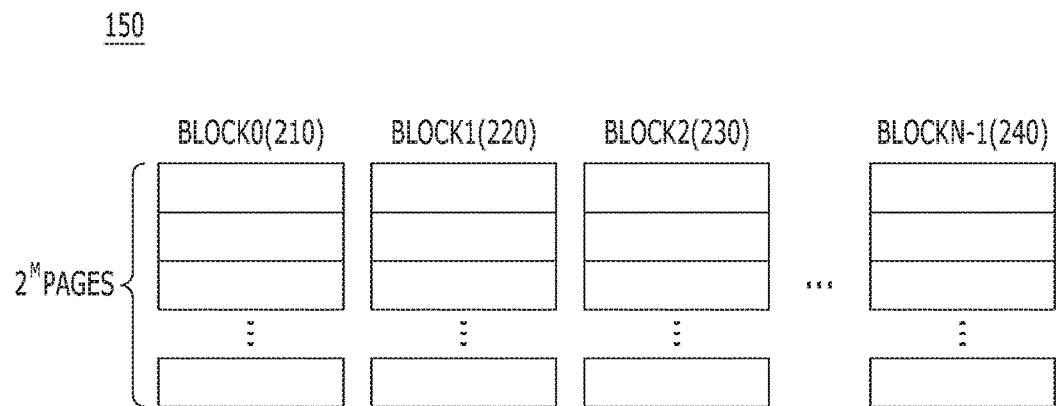
FIG. 2 is a schematic diagram illustrating an exemplary configuration of a memory device employed in the memory system of FIG. 1.
Figure 3:
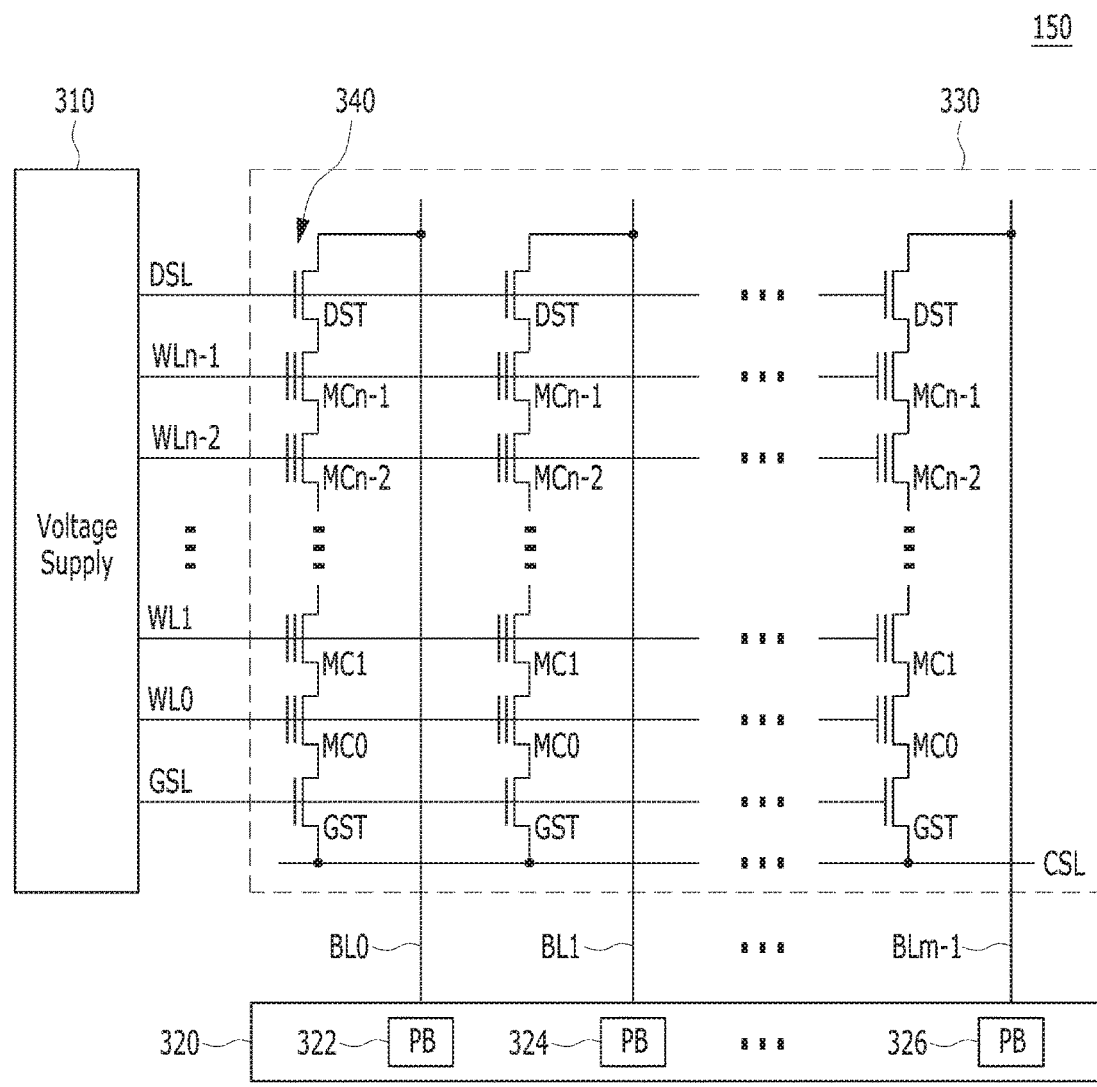
FIG. 3 is a circuit diagram illustrating an exemplary configuration of a memory cell array of a memory block in the memory device shown in FIG. 1.
Figure 4:
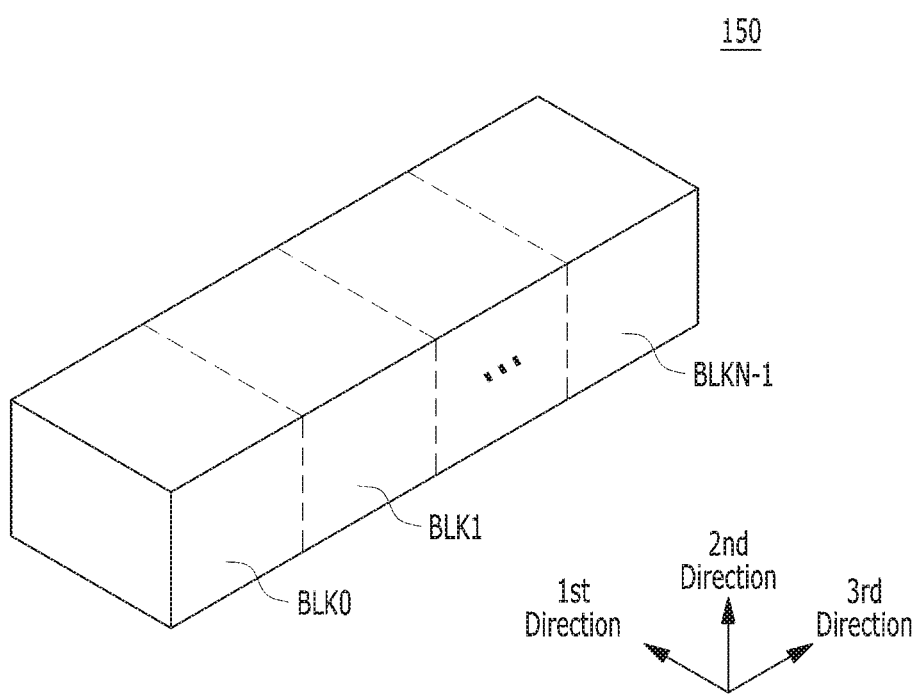
FIG. 4 is a block diagram illustrating an exemplary three-dimensional structure of the memory device shown in FIG. 2.

FIG. 2 is a schematic diagram illustrating the memory device 150, FIG. 3 is a circuit diagram illustrating an exemplary configuration of a memory cell array of a memory block in the memory device 150, and FIG. 4 is a schematic diagram illustrating an exemplary 3D structure of the memory device 150.

Referring to FIG. 2, the memory device 150 may include a plurality of memory blocks BLOCK0 to BLOCKN-1, e.g., BLOCK0 (210), BLOCK1 (220), BLOCK2 (230), and BLOCKN-1 (240). Each of the memory blocks 210, 220, 230 and 240 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

Also, the memory device 150 may include a plurality of memory blocks, which may include a single level cell (SLC) memory block storing 1-bit data and/or a multi-level cell (MLC) memory block storing 2-bit data. The SLC memory blocks may include a plurality of pages that are realized by memory cells storing one-bit data in one memory cell. The SLC memory blocks may have a quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. Particularly, the memory device 150 may include not only the MLC memory blocks, each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell, and so forth.

In accordance with an embodiment of the present invention, the memory device 150 is described as a non-volatile memory, such as a flash memory, e.g., a NAND flash memory. However, the memory device 150 may be realized as any of a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

The memory blocks 210, 220, 230 and 240 may store the data transferred from the host 102 through a program operation, and transfer data stored therein to the host 102 through a read operation.

Referring to FIG. 3, a memory block 330, which may correspond to any of the plurality of memory blocks 152 to 156 included in the memory device 150 of the memory system 110, may include a plurality of cell strings 340 coupled to a plurality of corresponding bit lines BL0 to BLm-1. The cell string 340 of each column may include one or more drain select transistors DST and one or more ground select transistors GST. Between the drain and ground select transistors DST and GST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1. For reference, in FIG. 3, 'DSL' denotes a drain select line, 'GSL' denotes a ground select line, and 'CSL' denotes a common source line.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a two-dimensional (2D) or three-dimensional (3D) memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLOCK0 to BLOCKN−1. FIG. 4 is a block diagram illustrating the memory blocks 152 to 156 of the memory device 150 shown in FIG. 1. Each of the memory blocks 152 to 156 may be realized in a 3D structure (or vertical structure). For example, the memory blocks 152 to 156 may be a three-dimensional structure with dimensions extending in first to third directions, e.g., an x-axis direction, a y-axis direction, and a z-axis direction.

Each memory block 330 included in the memory device 150 may include a plurality of NAND strings NS that are extended in the second direction, and a plurality of NAND strings NS (not shown) that are extended in the first direction and the third direction. Each of the NAND strings NS may be coupled to a bit line BL, at least one string selection line SSL, at least one ground selection line GSL, a plurality of word lines WL, at least one dummy word line DWL (not shown), and a common source line CSL, and each of the NAND strings NS may include a plurality of transistor structures TS (not shown).

In short, each memory block 330 among the memory blocks 152 to 156 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Memory cells MC may be provided between the string selection transistor SST and the ground selection transistor GST of each NAND string NS. In other words, a plurality of memory cells may be realized in each memory block 330 of the memory blocks 152 to 156 of the memory device 150.

A data processing operation of a memory device, particularly, a data processing operation performed when a plurality of command operations corresponding to a plurality of commands are performed, in a memory system in accordance with an embodiment of the present invention is described in detail with reference to FIGS. 5 to 7.

Figure 5:
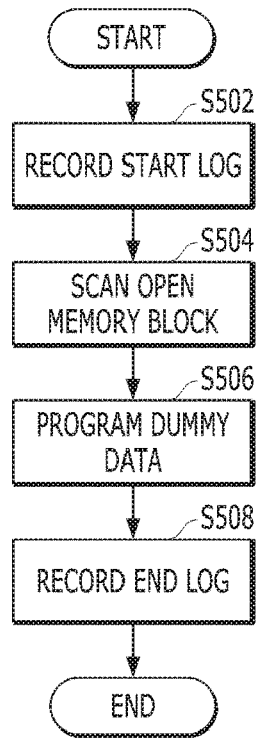
FIG. 5 is a flowchart illustrating an operation of a memory system in accordance with an embodiment of the present invention.

FIG. 5 is a flowchart illustrating a sudden power-off recovery (SPOR) operation of a memory system, for example, the memory system 110 of FIG. 1, in accordance with an embodiment of the present invention.

When the memory system 110 is booted up after sudden power-off (SPO) occurs therein, the SPOR operation may be performed. The SPOR operation may include a start log recording or storing operation of step S502, an open memory block scanning operation of step S504, a dummy data programming operation of step S506, and an end log recording or storing operation of step S508.

At step S502, the controller 130 may record or store a start log indicating a start of the SPOR operation in a log region (not illustrated) included therein. The log region may be included in memory 144 of FIG. 1.

At step S504, the controller 130 may perform a scan operation of detecting an open memory block among the plurality of memory blocks 152 to 156 included in the memory device 150.

The open memory block may include an erase page in which data may be programmed, a programmed page in which data is programmed, and a boundary page in which a program operation is stopped due to the SPO occurring during the program operation.

Figure 6:
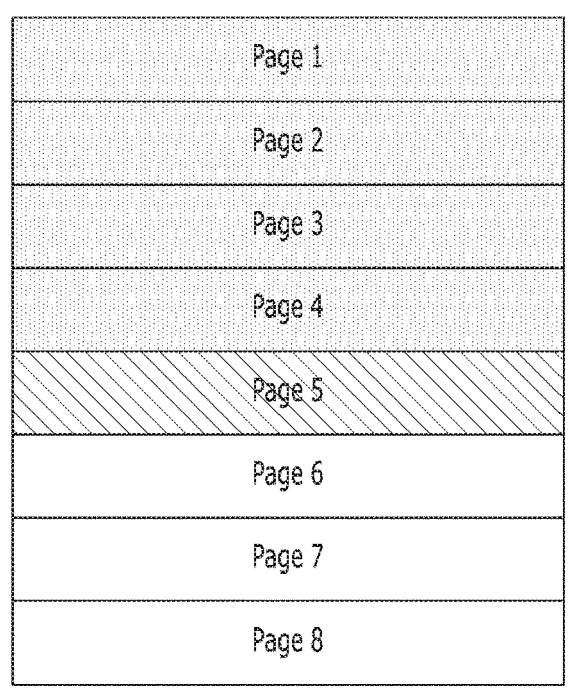
FIG. 6 is a schematic diagram illustrating a memory block.

FIG. 6 is a schematic diagram illustrating an example of a memory block, for example, the memory block 330 of FIG. 3 including 8 pages.

Referring to FIG. 6, Page 1 to Page 4 may be the programmed pages, Page 5 may be the boundary page, and Page 6 to Page 8 may be the erase pages.

Through the open memory block scanning operation at the step S504 of FIG. 5, the boundary page may be detected in the open memory block. The controller 130 may perform the scanning operation in a reverse order from a last page of the open memory block. The controller 130 may perform the scanning operation on a page basis until the boundary page is detected in the open memory block.

For example, in FIG. 6, the controller 130 may start the scanning operation from Page 8 of the memory block. Since Page 8 is the erase page, the controller 130 may perform the scanning operation onto Page 7. In this manner, the controller 130 may complete the open memory block scanning operation after performing the scanning operation up to Page 5, which is the boundary page.

Referring back to FIG. 5, at step S506, the controller 130 may perform the dummy data programming operation. During the dummy data programming operation, the controller 130 may control the memory device to program dummy data into the erase page. The erase page may be a previous page of the boundary page of the open memory block, in a scan order.

At step S508, the controller 130 may record or store an end log indicating completion of the SPOR operation in the log region.

Meanwhile, the SPO may recur during the SPOR operation. In this case, as the SPOR operation is performed again, the open memory block scanning operation may be repeatedly performed, and thus a disturbance phenomenon may occur in the memory blocks. Particularly, when the SPO occurs after a similar time elapses from each start moment of the repeated SPOR operations, the scanning operation may be repeatedly performed onto a specific page of the same open memory block, whereby the disturbance phenomenon of the specific page may intensify. Embodiments of the present invention propose a method capable of reducing reliability degradation of a memory block by dispersing or reducing the disturbance phenomenon that may be concentrated on a specific page to a plurality of pages when the SPO recurs during the SPOR operation and the phenomenon is repeated.

Figure 7:
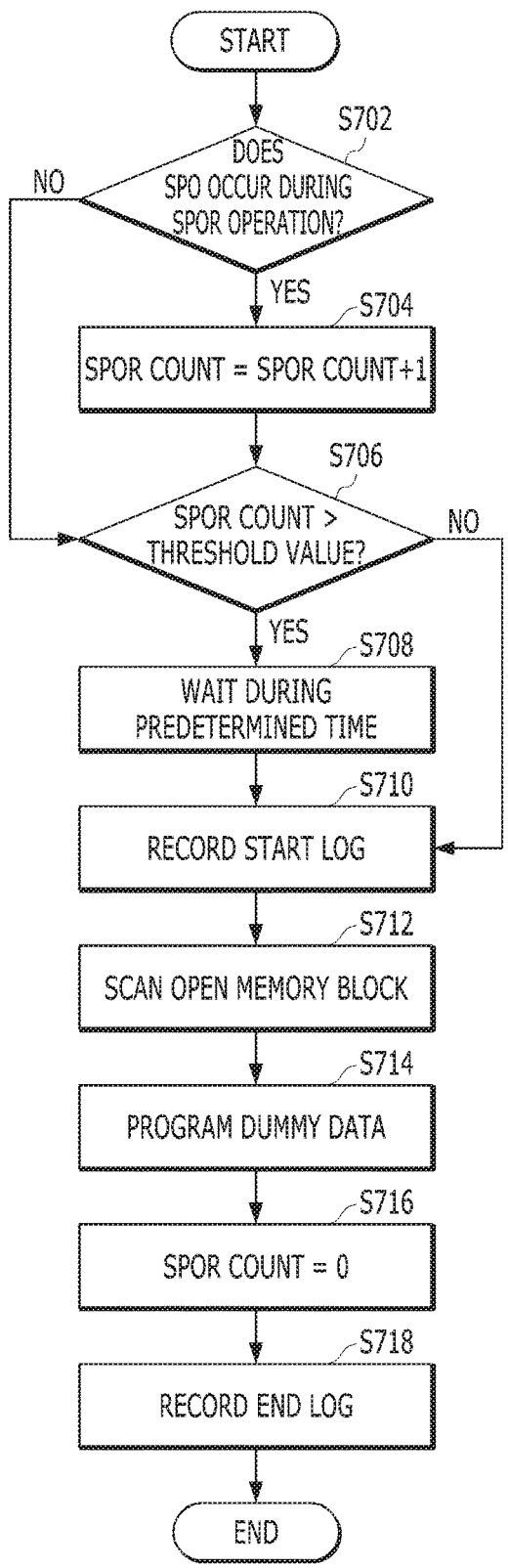
FIG. 7 is a flowchart illustrating a boot-up operation of a memory system in accordance with an embodiment of the present invention.

FIG. 7 is a flowchart illustrating a boot-up operation of a memory system, for example, the memory system 110 of FIG. 1, in accordance with an embodiment of the present invention.

When the memory system 110 is booted up after the SPO occurs, at step S702, the controller 130 may check whether or not the boot-up operation is performed due to the SPO occurring during the SPOR operation. When the end log is not recorded after the start log is recorded or stored in the log region of the controller 130, the controller 130 may determine that the SPO has occurred during the SPOR operation.

When the boot-up operation is performed because the SPO occurs during the SPOR operation (that is, "YES" at step S702), the controller 130 may increase an SPOR count value at step S704. The SPOR count value may represent a number of times that the SPOR operation is successively performed as the SPO occurs during the SPOR operation. When the boot-up operation is not performed because the SPO does not occur during the SPOR operation (that is, "NO" at step S702), the controller 130 may check whether or not the SPOR count value exceeds a predetermined threshold value, at step S706.

At step S706, the controller 130 may check whether or not the SPOR count value exceeds a predetermined threshold value. When the SPOR count value exceeds the predetermined threshold value (that is, "YES" at step S706), the controller 130 may control the memory device 150 to wait without performing any operation during a predetermined waiting time at step S708. When the SPOR count value does not exceed the predetermined threshold value (that is, "NO" at step S706), the controller 130 may perform the start log recording operation, at step S710.

When performance of the SPOR operation is delayed at step S708, a number of times that the memory device 150 performs the open memory block scanning operation may be reduced during the repeated SPOR operations, whereby a read disturbance phenomenon caused by the open memory block scanning operation may be reduced. A method of determining the waiting time will be described in detail below.

After the waiting time elapses, the controller 130 may perform the start log recording operation, which is described above with reference to the step S502 shown in FIG. 5, at step S710. At step S712, the controller 130 may perform the open memory block scanning operation, which is described above with reference to the step S504 shown in FIG. 5. At step S714, the controller 130 may perform the dummy data programming operation, which is described above with reference to the step S506 shown in FIG. 5.

When operations of the steps S710 to S714 are successfully performed, the controller 130 may initialize the SPOR count value at step S716. At step S718, the controller 130 may perform the end log recording operation, which is described above with reference to the step S508 shown in FIG. 5. Consequently, the SPOR operation may be completed.

When the SPOR count value does not exceed the predetermined threshold value (that is, "NO" at step S706), the controller 130 may perform the operation of the step S710.

When the boot-up operation is performed due to any reason other than the SPO occurring during the SPOR operation (that is, "NO" at step S702), the controller 130 may not increase the SPOR count value and may carry out the step S706 without performing the step S704. Since this case is when the SPO does not occur before or the SPOR operation is successfully completed after the SPO occurs, the SPOR count value may be in a state of being initialized. Accordingly, it may be determined that the SPOR count value does not exceed the predetermined threshold value (that is, "NO" at step S706). Subsequently, the controller 130 may perform the operation of the step S710 without performing the step S708.

When the SPO occurs during the operations of the steps S710 to S718, the memory system 110 may be booted up again, thereby performing the boot-up operation in accordance with the embodiment of the present invention. Accordingly, the SPOR count value may increase at step S704 via the step S702, and the operations of the steps S706 to S718 may be performed.

The predetermined waiting time of the step S708 may be determined as follows.

In accordance with an embodiment of the present invention, a time required for the open memory block scanning operation may be set to the predetermined waiting time. The time required for the open memory block scanning operation may be determined as a time required to perform a read operation onto a single memory block, assuming a worst case.

Meanwhile, even though the SPO occurs repeatedly, a repetition period may vary. For example, it may be assumed that a time until the SPO occurs after the memory system 110 is booted up becomes longer.

Accordingly, in accordance with an embodiment of the present invention, the predetermined waiting time may gradually increase whenever the SPOR operation is performed.

In accordance with an embodiment of the present invention, the predetermined waiting time may gradually decrease whenever the SPOR operation is performed.

In accordance with an embodiment of the present invention, the predetermined waiting time may be determined at random whenever the SPOR operation is performed.

In accordance with an embodiment of the present invention, the time required for the open memory block scanning operation may be set to a lower limit of the predetermined waiting time.

In accordance with an embodiment of the present invention, within the lower limit of the predetermined waiting time, the predetermined waiting time may be determined as a constant time as described above, or may gradually increase or decrease or be determined at random whenever the SPOR operation is performed.

There may be a case where an upper limit of a time for performing the SPOR operation in the memory system 110 is determined in advance. This may be defined as a maximum SPOR time. When the predetermined waiting time is determined to be too long, the maximum SPOR time may elapse during the SPOR operation after the waiting time elapses, and consequently the SPOR operation has to be terminated halfway.

Accordingly, in accordance with an embodiment of the present invention, considering the maximum SPOR time, the upper limit of the predetermined waiting time may be determined. For example, a sum of the upper limit of the predetermined waiting time and a time where the SPOR operation is performed in actuality may be determined not to exceed the maximum SPOR time.

In accordance with an embodiment of the present invention, within the upper limit of the predetermined waiting time, the predetermined waiting time may be determined at random or as the constant time or may gradually increase or decrease whenever the SPOR operation is performed.

Even though the time until the SPO occurs after the memory system 110 is booted up is sufficient to successfully complete the SPOR operation, the SPOR operation may not be completed and the SPO may occur due to the predetermined waiting time.

Accordingly, in accordance with an embodiment of the present invention, even though the SPOR count value is beyond the predetermined threshold value, the predetermined waiting time may be set to "0" when the SPOR count value is a multiple of a predetermined number, or the predetermined waiting time may be set to "0" at random according to the SPOR count so that the SPOR operation may be performed immediately.

When the SPO occurs repeatedly during the SPOR operation, the memory device 150 may wait without performing any operation during the predetermined waiting time before the SPOR operation starts, whereby the number of times that the memory device 150 performs the open memory block scanning operation may be reduced. Consequently, the disturbance phenomenon caused by the open memory block scanning operation may be weakened.

FIGS. 8 to 16 are diagrams schematically illustrating application examples of the data processing system of FIGS. 1 to 7 according to various embodiments.

Figure 8:
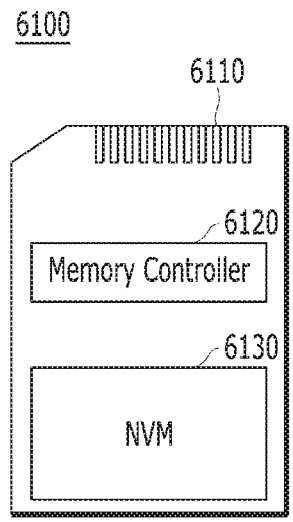
FIGS. 8 to 16 are diagrams schematically illustrating application examples of the data processing system, in accordance with various embodiments of the present invention.

FIG. 8 is a diagram schematically illustrating the data processing system including the memory system in accordance with an embodiment. FIG. 8 schematically illustrates a memory card system 6100 to which the memory system in accordance with an embodiment is applied.

Referring to FIG. 8, the memory card system 6100 may include a memory controller 6120, a memory device 6130 and a connector 6110.

More specifically, the memory controller 6120 may be connected to the memory device 6130 embodied by a nonvolatile memory (NUM), and configured to access the memory device 6130. For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, as shown in FIG. 1, the memory controller 6120 may include a random access memory (RAM), a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices or particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a PC card (e.g., Personal Computer Memory Card International Association (PCMCIA)), a compact flash (CF) card, a smart media card (e.g., SM and SMC), a memory stick, a multi-media card (e.g., MMC, RS-MMC, MMCmicro and eMMC), an secured digital (SD) card (e.g., SD, miniSD, microSD and SDHC) and a universal flash storage (UFS).

Figure 9:
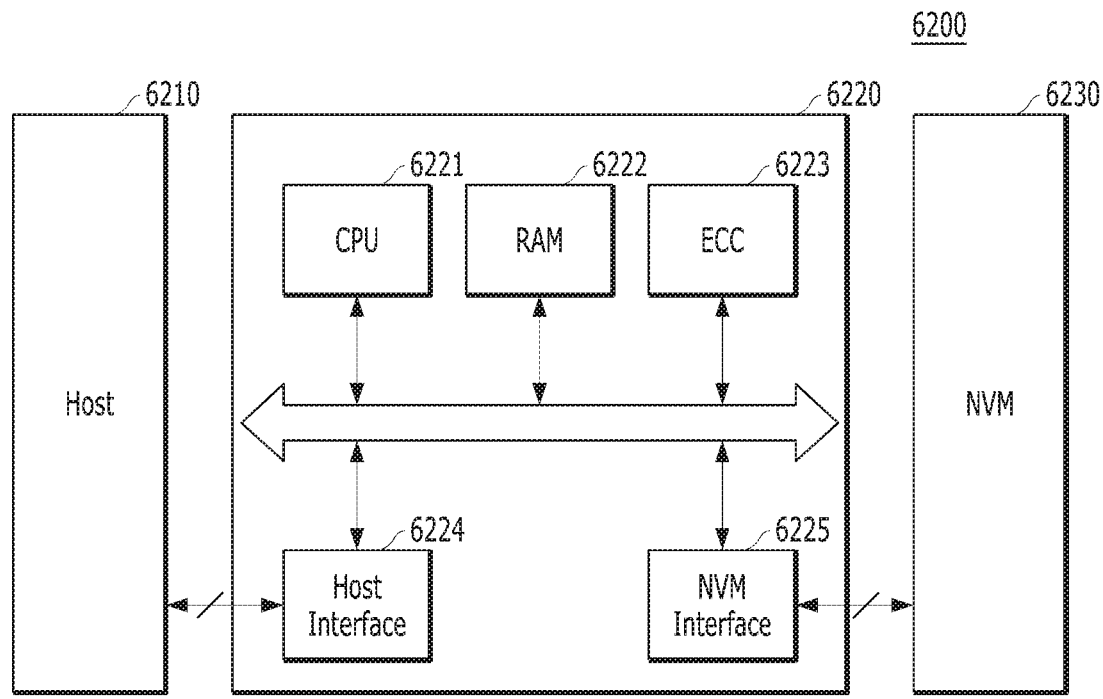

FIG. 9 is a diagram schematically illustrating another example of a data processing system 6200 including the memory system in accordance with an embodiment.

Referring to FIG. 9, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit and/or receive data to and/or from the host 6210 through the host interface 6224, and transmit/receive data to/from the memory device 6230 through the NVM interface 6225. The host interface 6224 may be connected to the host 6210 through a parallel advanced technology attachment (PATA) bus, serial advanced technology attachment (SATA) bus, small computer system interface (SCSI), universal serial bus (USB), peripheral component interconnect-express (PCIe) or NAND interface. The memory controller 6220 may have a wireless communication function with a mobile communication protocol such as wireless fidelity (WiFi) or Long Term Evolution (LTE). The memory controller 6220 may be connected to an external device, for example, the host 6210 or another external device, and then transmit and/or receive data to and/or from the external device. In particular, as the memory controller 6220 is configured to communicate with the external device through one or more of various communication protocols, the memory system and the data processing system in accordance with an embodiment may be applied to wired and/or wireless electronic devices or particularly a mobile electronic device.

Figure 10:
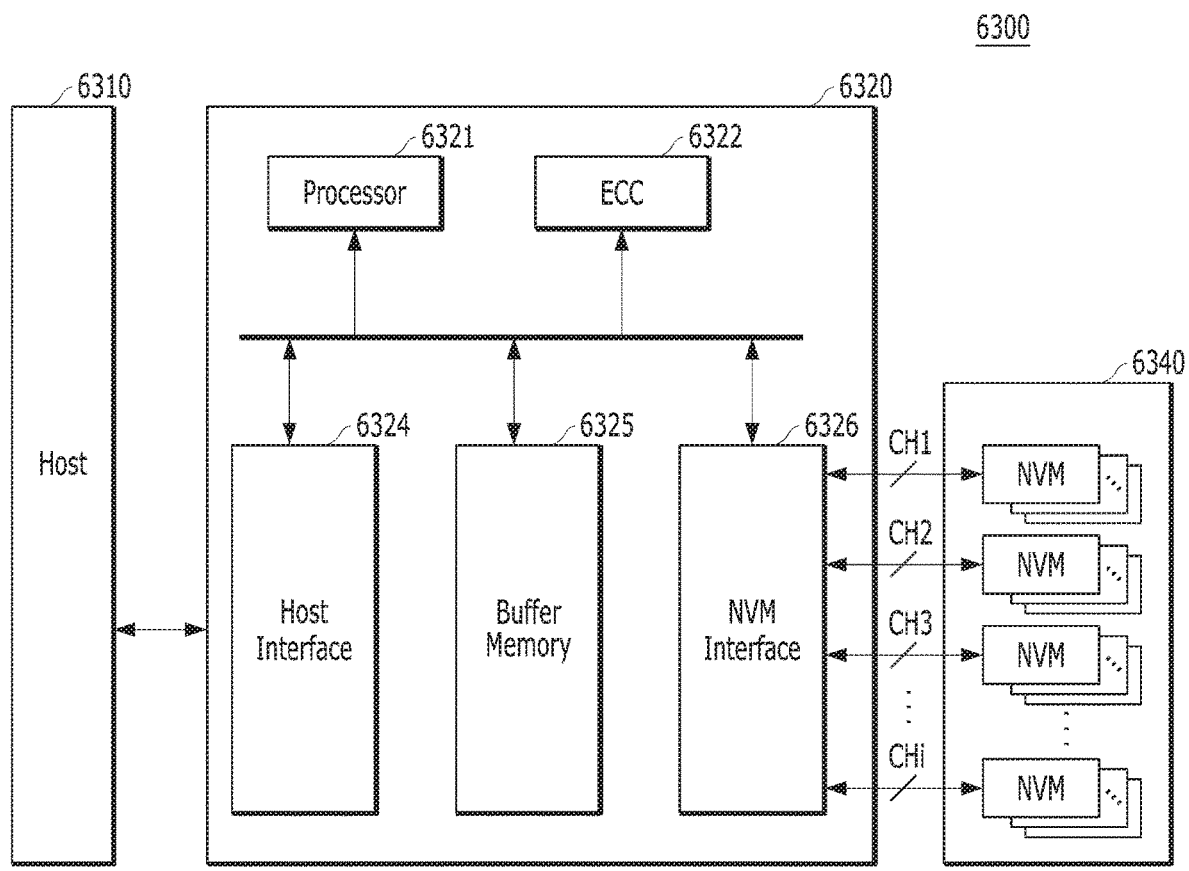

FIG. 10 is a diagram schematically illustrating another example of the data processing system including the memory system in accordance with an embodiment. FIG. 10 schematically illustrates a solid state drive (SSD) 6300 to which the memory system may be applied.

Referring to FIG. 10, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as dynamic random access memory (DRAM), synchronous DRAM (SDRAM), double data rate (DDR) SDRAM, low power DDR (LPDDR) SDRAM and graphics RAM (GRAM) or nonvolatile memories such as ferroelectric RAM (FRAM), resistive RAM (RRAM or ReRAM), spin-transfer torque magnetic RAM (STT-MRAM) and phase-change RAM (PRAM). For convenience of description, FIG. 10 illustrates that the buffer memory 6325 exists in the controller 6320. However, the buffer memory 6325 may exist outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
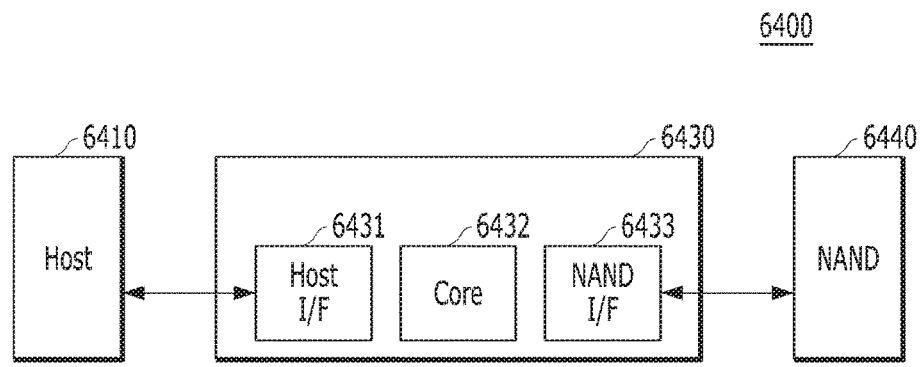

FIG. 11 is a diagram schematically illustrating another example of the data processing system including the memory system in accordance with an embodiment. FIG. 11 schematically illustrates an embedded Multi-Media Card (eMMC) 6400 to which the memory system may be applied.

Referring to FIG. 11, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 12 to 15 are diagrams schematically illustrating other examples of the data processing system including the memory system in accordance with one or more embodiments. FIGS. 12 to 15 schematically illustrate universal flash storage (UFS) systems to which the memory system may be applied.

Referring to FIGS. 12 to 15, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices or particularly mobile electronic devices, the UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols. The UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 9 to 11, and the UFS cards 6530, 6630, 6730 and 6830 may be embodied in the form of the memory card system 6100 described with reference to FIG. 8.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), multi-media card (MMC), secure digital (SD), mini-SD, and micro-SD.

Figure 12:
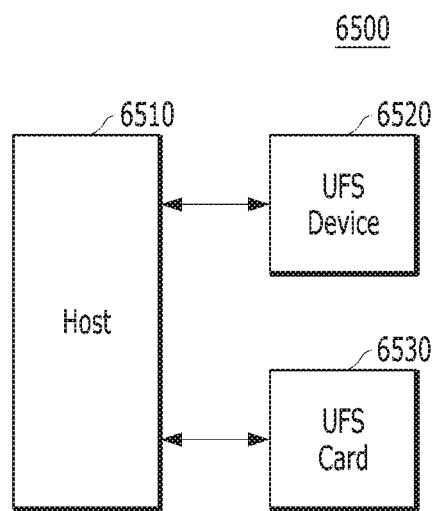

In the UFS system 6500 illustrated in FIG. 12, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 13:
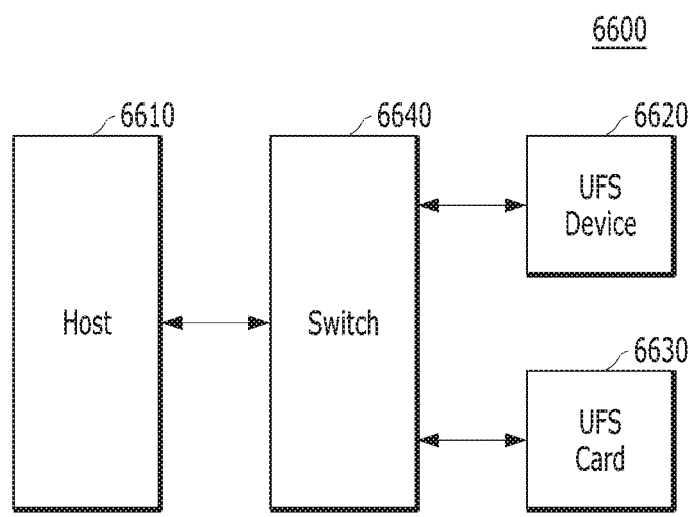

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 14:
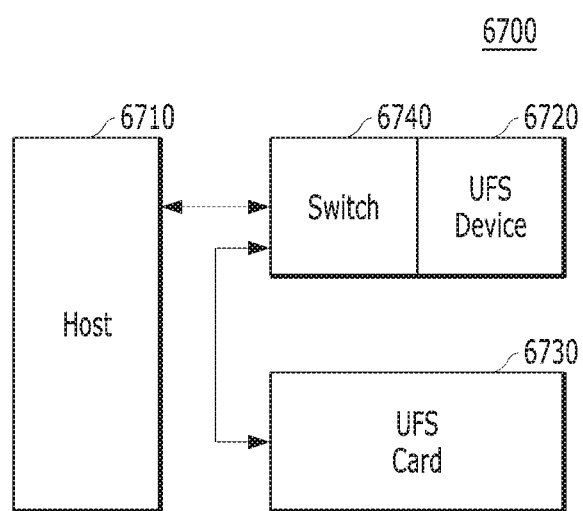

In the UFS system 6700 illustrated in FIG. 14, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
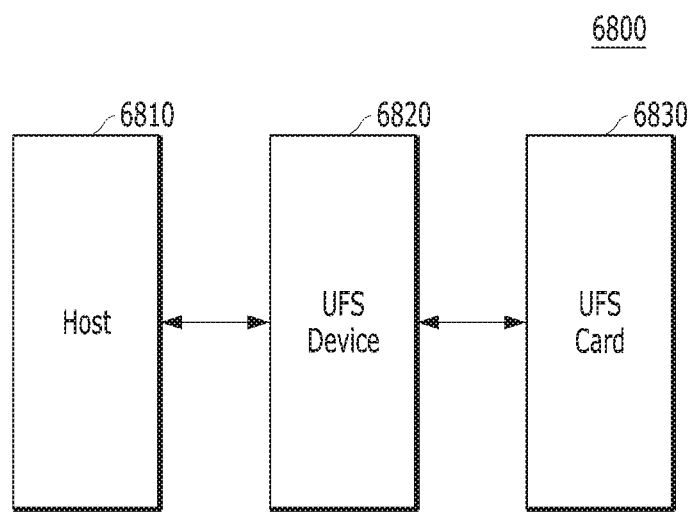

In the UFS system 6800 illustrated in FIG. 15, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
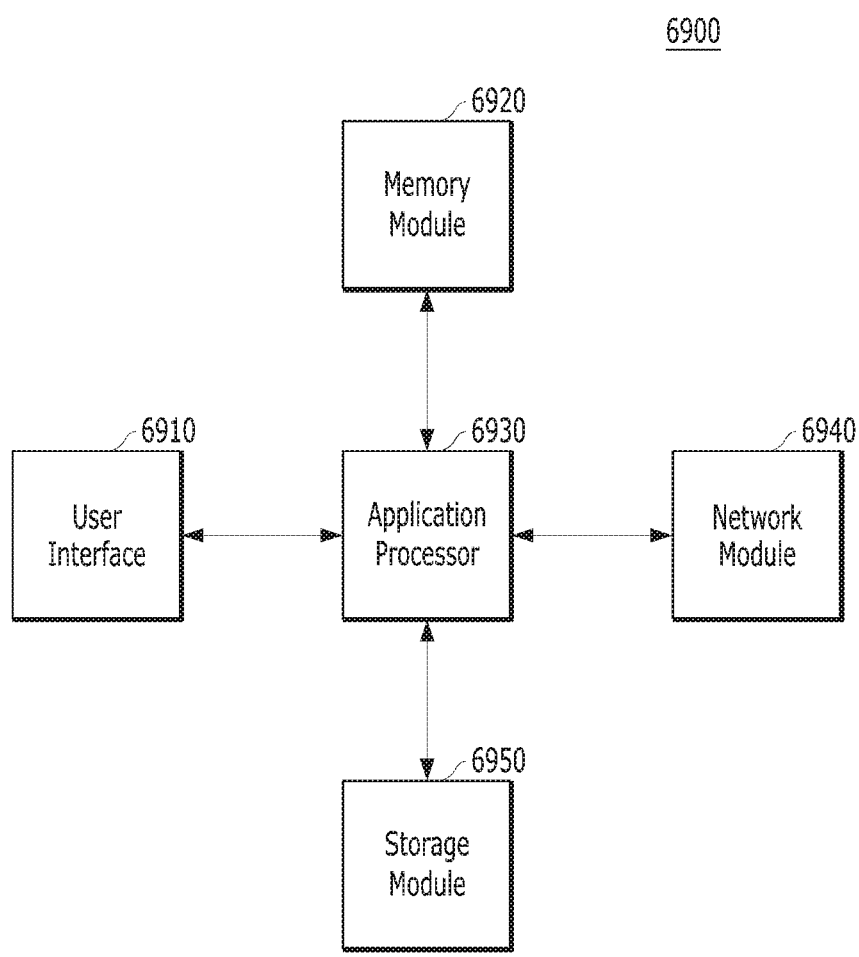

FIG. 16 is a diagram schematically illustrating another example of the data processing system including the memory system in accordance with an embodiment. FIG. 16 is a diagram schematically illustrating a user system 6900 to which the memory system may be applied.

Referring to FIG. 16, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

According to embodiments of the present invention, a memory system and an operating method of the memory system are capable of processing data with a memory device quickly and stably by minimizing the complexity and performance deterioration of the memory system and maximizing the utility efficiency of the memory device.

While the present invention has been described with respect to specific embodiments, it will be apparent to those skilled in the art in light of this disclosure that various changes and modifications may be made without departing from the spirit and scope of the invention as defined in the following claims.

What is claimed is:

1. An operating method of a memory system, comprising:
   performing a boot-up operation;
   determining whether a sudden power-off recovery (SPOR) operation is performed successively a predetermined number of times; and
   performing additional SPOR operation when a predetermined waiting time elapses after performing the boot-up operation according to a result of the determining.

2. The operating method of claim 1, wherein the predetermined waiting time is determined based on a maximum SPOR time.

3. The operating method of claim 1, wherein the predetermined waiting time is determined based on a time of an open memory block scanning operation.

4. The operating method of claim 1, wherein the predetermined waiting time is determined at random whenever the SPOR operation is performed.

5. The operating method of claim 1, wherein the predetermined waiting time increases whenever the SPOR operation is performed.

6. The operating method of claim 1, wherein the predetermined waiting time decreases whenever the SPOR operation is performed.

7. The operating method of claim 1, wherein the predetermined waiting time is constant regardless of a number of times that the SPOR operation is performed.

8. The operating method of claim 1, wherein the predetermined waiting time is determined as "0" according to a number of times that the SPOR operation is performed.

9. The operating method of claim 1, wherein the performing of the SPOR operation includes:
   storing a start log in a log region included in the memory of the controller;

detecting a boundary page where a program operation is interrupted due to occurrence of sudden power-off (SPO) by scanning an open memory block;
programming dummy data in a page subsequent to the boundary page; and
storing an end log in the log region.

10. A memory system, comprising:
a memory device suitable for storing data; and
a controller suitable for controlling the memory device,
wherein the controller performs a boot-up operation, determines whether a sudden power-off recovery (SPOR) operation is performed successively a predetermined number of times, and performs additional SPOR operation when a predetermined waiting time elapses after performing the boot-up operation according to a result of the determining.

11. The memory system of claim 10, wherein the predetermined waiting time is determined based on a maximum SPOR time.

12. The memory system of claim 10, wherein the predetermined waiting time is determined based on a time of an open memory block scanning operation.

13. The memory system of claim 10, wherein the predetermined waiting time is determined at random whenever the SPOR operation is performed.

14. The memory system of claim 10, wherein the predetermined waiting time increases whenever the SPOR operation is performed.

15. The memory system of claim 10, wherein the predetermined waiting time decreases whenever the SPOR operation is performed.

16. The memory system of claim 10, wherein the predetermined waiting time is constant regardless of a number of times that the SPOR operation is performed.

17. The memory system of claim 10, wherein the controller performs the SPOR operation including an operation of storing a start log in a log region included in the memory of the controller, an operation of detecting a boundary page where a program operation is interrupted due to occurrence of sudden power-off (SPO) by scanning an open memory block, an operation of programming dummy data in a page subsequent to the boundary page, and an operation of storing an end log in the log region.

18. An operating method of a memory system, comprising:
performing a boot-up operation;
determining whether the boot-up operation is performed due to a sudden power-off (SPO) occurring during a sudden power-off recovery (SPOR) operation;
when it is determined that the boot-up operation is performed due to the SPO occurring during the SPOR operation, determining whether the SPOR operation is performed successively a predetermined number of times;
when it is determined that the SPOR operation is performed successively the predetermined number of times, waiting a predetermined time after performing the boot-up operation; and
performing additional SPOR operation when the predetermined time elapses after performing the boot-up operation.

19. The operating method of claim 18, wherein the performing of the additional SPOR operation includes:
storing a start log in a log region of a memory;
detecting a boundary page where a program operation is interrupted due to occurrence of SPO by scanning an open memory block;
programming dummy data in a page subsequent to the boundary page; and
storing an end log in the log region.

20. The operating method of claim 19, wherein the determining whether the boot-up operation is performed due to the SPO occurring during the SPOR operation includes:
determining the boot-up operation is performed due to the SPO occurring during the SPOR operation when the start log is stored but the end log is not stored in the log region.

* * * * *